US012699122B2

(12) United States Patent
    Siau et al.

(10) Patent No.: US 12,699,122 B2
(45) Date of Patent: Aug. 4, 2026

(54) SYSTEM FOR IDENTIFYING ELECTRICAL DEVICES

(71) Applicant: SOURCE TO SITE ACCESSORIES LIMITED, St. Albans (GB)

(72) Inventors: Loong Yen Johann Siau, St. Albans (GB); Michael James Godfrey, St. Albans (GB)

(73) Assignee: SOURCE TO SITE ACCESSORIES LIMITED, St. Albans (GB)

( * ) Notice: Subject to any disclaimer, the term of this patent is extended or adjusted under 35 U.S.C. 154(b) by 39 days.

(21) Appl. No.: 17/258,334

(22) PCT Filed: Jul. 9, 2019

(86) PCT No.: PCT/GB2019/051928
    § 371 (c)(1),
    (2) Date: Jan. 6, 2021

(87) PCT Pub. No.: WO2020/012172
    PCT Pub. Date: Jan. 16, 2020

(65) Prior Publication Data
    US 2021/0270876 A1      Sep. 2, 2021

(30) Foreign Application Priority Data
    Jul. 12, 2018    (WO) ................ PCT/GB2018/051991

(51) Int. Cl.
    *G01R 21/133*        (2006.01)
    *G01R 19/25*         (2006.01)
    (Continued)

(52) U.S. Cl.
    CPC ..... *G01R 21/1331* (2013.01); *G01R 19/2513* (2013.01); *G10L 19/06* (2013.01); *H01R 13/6683* (2013.01); *H02J 13/10* (2026.01)

(58) Field of Classification Search
    CPC . Y02B 70/3225; Y04S 20/242; Y04S 20/222; Y04S 20/20; Y04S 20/30;
    (Continued)

(56) References Cited

U.S. PATENT DOCUMENTS 8,156,055 B2 *    4/2012    Shimada ........... H02J 13/00022
                                                          706/12
    9,389,253 B2 *    7/2016    Costa ................... G06F 11/3072
    (Continued)

FOREIGN PATENT DOCUMENTS

CN        101128968 A      2/2008
    CN        102947716 A      2/2013
    (Continued)

OTHER PUBLICATIONS

Hacine-Gharbi A, Ravier P. (Wavelet Cepstral Coefficients for Electrical Appliances Identification using Hidden Markov Models. InICPRAM Jan. 16, 2018 (pp. 541-549). (Year: 2018).*
    (Continued)

*Primary Examiner* — Darrin D Dunn
(74) *Attorney, Agent, or Firm* — Patterson + Sheridan, LLP

(57)                ABSTRACT

The invention relates to a system to identify an electrical device connected to an electrical outlet. The electrical outlet has a sensor configured to measure an electrical signal of an electricity supply to the electrical device connected to the electrical outlet. A processor is configured to receive the measured electrical signal and determine an electrical signature of the electrical device based on one or more features of a frequency domain spectrum of the electrical signal. A processor is configured to compare the electrical signature against a signature database to identify the electrical device.

12 Claims, 4 Drawing Sheets

(51) Int. Cl.
G10L 19/06 (2013.01)
H01R 13/66 (2006.01)
H02J 13/10 (2026.01)

(58) Field of Classification Search
CPC ..... G05B 13/021; G06F 1/266; G06F 1/3203; H02J 3/14; H02J 2310/70; H02J 13/00001; H02J 13/00004; H02J 7/00045; G01D 2204/24; G01D 4/004
See application file for complete search history.

(56) References Cited

U.S. PATENT DOCUMENTS

| | | | | |
|---|---|---|---|---|
| 9,524,638 | B2 * | 12/2016 | Kim | G08C 23/02 |
| 2009/0072985 | A1 | 3/2009 | Patel et al. | |
| 2010/0145542 | A1 | 6/2010 | Chapel et al. | |
| 2010/0280978 | A1 | 11/2010 | Shimada et al. | |
| 2011/0184580 | A1 | 7/2011 | Kawamoto et al. | |
| 2011/0202194 | A1 * | 8/2011 | Kobraei | G06Q 10/06 |
| | | | | 702/62 |
| 2011/0313582 | A1 * | 12/2011 | van Megen | G01D 4/00 |
| | | | | 700/297 |
| 2012/0004871 | A1 * | 1/2012 | Tsao | G01R 19/2513 |
| | | | | 702/61 |
| 2012/0239959 | A1 * | 9/2012 | Kiuchi | G01R 21/133 |
| | | | | 713/340 |
| 2012/0290230 | A1 * | 11/2012 | Berges Gonzalez | G01D 4/004 |
| | | | | 702/61 |
| 2013/0201018 | A1 * | 8/2013 | Horstemeyer | G08B 21/18 |
| | | | | 340/539.14 |
| 2013/0204617 | A1 | 8/2013 | Kuo et al. | |
| 2015/0185262 | A1 * | 7/2015 | Song | G06N 20/10 |
| | | | | 702/64 |
| 2016/0127874 | A1 | 5/2016 | Kingsmill et al. | |
| 2016/0306417 | A1 | 10/2016 | Greig et al. | |
| 2016/0353250 | A1 * | 12/2016 | Kingsmill | H04M 1/72412 |
| 2018/0041071 | A1 * | 2/2018 | Chapel | H02J 13/00028 |
| 2018/0253644 | A1 * | 9/2018 | Tan | H02J 13/0005 |

FOREIGN PATENT DOCUMENTS

| | | |
|---|---|---|
| CN | 104868326 A | 8/2015 |
| CN | 204651612 U | 9/2015 |
| EP | 2348608 A2 | 7/2011 |
| KR | 20170016694 A | 2/2017 |

OTHER PUBLICATIONS

S. Kong, Y. Kim, R. Ko and S.-K. Joo, "Home appliance load disaggregation using cepstrum-smoothing-based method," in IEEE Transactions on Consumer Electronics, vol. 61, No. 1, pp. 24-30, Feb. 2015, doi: 10.1109/TCE.2015.7064107., (Year: 2015).*

International Search Report and Written Opinion dated Jan. 16, 2020 for Application No. PCT/GB2019/051928.

Chinese Office Action dated Sep. 6, 2023 for Application No. 2019800583928.

Examination Report dated Nov. 30, 2023 for Application No. EP 19748886.9.

Examination Report for European Patent Office Action dtd Mar. 27, 2025 for Application No. 19748866.9.

"Hacine-Garbi Abdenour et al—Wavelet Cepstral Coefficients for Electrical Appliances Identification using Hidden Markov Models— Proceedings of the 7th Int'l Conference on Pattern Recognition Applications and Methods (online) (Apr. 11, 2018)".

* cited by examiner

Normalizing sensor signal — 401

Sampling sensor signal — 402

Segmenting data samples into a block — 403

Applying pre-emphasize filter — 404

Determining pitch of LPC signal — 405

Prediction of coefficients — 406

SYSTEM FOR IDENTIFYING ELECTRICAL DEVICES

FIELD OF THE INVENTION

The invention relates to a system to identify an electrical device connected to an electrical outlet. The invention further relates to an electrical outlet configured to supply electrical power to an electrical device and a server for controlling electrical devices connected to an electrical outlet.

BACKGROUND OF THE INVENTION

Plug-in wireless switches are known which allow a user to remotely switch on and off any device that is plugged into the wireless switch. However, the user has to remember which electrical device is connected to which wireless switch. He may accidently switch on or off the wrong device if he confuses the switches or, unknown to the user, another person has unplugged an electronic device from a wireless switch and plugged the electronic device into a different wireless switch.

Therefore there is a need to identify electrical device that are connected to a wireless switch.

This object is achieved by a system and an electrical outlet as claimed in the independent claims.

SUMMARY OF INVENTION

One aspect of the invention relates to a system to identify an electrical device connected to an electrical outlet. The electrical outlet comprises a sensor configured to measure an electrical signal (for example, an electrical waveform, such as a current or voltage waveform) of an electricity supply to the electrical device connected to the electrical outlet. A first processor is configured to receive the measured electrical signal and determine an electrical signature of the electrical device based on the electrical signal. A second processor is configured to compare the electrical signature against a signature database to identify the electrical device.

It should be noted that the first processor and the second processor need not necessarily be different processors. In some cases, it may be beneficial that the first processor and the second processor are the same. Similarly, the signature database may be deployed on a signature database server that may be identical to the signature determining server, or, alternatively may be located on a second server, for example in a different location.

The first processor for determining the electrical signature of the electrical device may be in the electrical outlet, to avoid transferring large amounts of sensor data across a network. Alternatively, the first processor for determining the electrical signature of the electrical device may be on a signature determining server, remote from the electrical outlet, and the electrical outlet may comprise a communications interface configured to send sensor data to the signature determining server across a wired or wireless network. Advantages are that the signature determining server can have more processing power than is available in the restricted footprint of the electrical outlet and cost of the electrical outlet may be reduced. The signature determining server may either be located in the same building as the electrical outlet (perhaps if the building contains a large number of electrical outlets) or in the cloud (for example, in the case of a home which contains few electrical outlets, where the cost of providing a dedicated server might be prohibitive).

In case the first processor for determining the electrical signature of the electrical device is on the same server as the server that comprises the signature database the first processor and the second processor may be identical, i.e. one single processor is used for determining the electrical signature of the electrical device and comparing the electrical signature against a signature database to identify the electrical device. Consequently the signature determining server and the signature database server would be running as two services on the same and only server.

The electrical outlet may be a place from which electricity may be drawn, such as an electrical socket fixed to a wall or floor of a building or in a vehicle. The electrical outlet may be a plug-in device, which plugs-in to an electrical socket in a building or vehicle and has a pass-through socket for supplying the electrical device with electricity. In more general terms, the electrical outlet may also include accessories to which electrical devices may be connected to, either permanently such as wall switches, or non-permanently, such as extension leads.

The invention is based on analysing an electrical signal of an electrical device to identify the device, for example in order to recognize that the electrical device has been relocated and plugged into a different socket. In the context of the invention, identification of an electrical device shall not be restricted to individual devices but should be also interpreted in a wider sense, for example for devices of the same type, for example hair straighteners of the same brand.

The electrical signal to identify an electrical device may comprise the current or power consumed by the electrical device, voltage spikes introduced to the supply voltage by the electrical device or some other distinctive ways that can be measured and used to identify the electrical device. The electrical signal may be sampled and processed by a processor that is implemented in the electrical outlet in order to generate an electrical signature of the electrical device. Electrical signature means that the electrical signal of the electrical device is transformed into a data format which not only allows for data reduction but also enables a server to recognize an electrical device as the same electrical device even when the electrical signals of that electrical device changes due to parasitic effects, for example, heat variations when the ambient temperature changes, or variations introduced to electrical devices of the same batch during production. Thus, the server can compare the electrical signature of an electrical device received from an electrical outlet to a database of electrical signatures of electrical devices, for example to decide if the electrical device is already included in the database of electrical signatures.

The electrical signature of an electrical device is ideally unique to the particular electrical device, to identify the electrical device and to distinguish it from other electrical devices of different types. For example, the electrical signature is ideally such that a phone charger from brand "A" should be distinguished from a phone charger from brand "B" if they are genuinely different in their electrical design. The electrical signature is therefore ideally robust against small variations in the parameters of the electrical components used for the electrical device but sufficiently sensitive to distinguish electrical device for the same purpose, but of different makes.

The electrical signature of the electrical device may be based on one or more features of a frequency domain spectrum of the electrical signal. The inventors have discovered that various algorithms can be used to extract distinctive and characteristic features from the frequency domain spectrum of the electrical device which can be used to identify the electrical device and distinguish it from other electrical devices.

The inventors have discovered that particularly suitable algorithms for extracting one or more identifying and characteristic features of the electrical device from the frequency domain spectrum of the electrical signal include audio coding algorithms (which are typically used to encode and compress audio data, such as, speech coding algorithms which are used to compress speech for cellular and internet transmission or for speech recognition) and audio feature extraction algorithms (which are typically used to extract characteristic features from audio signals so that they can be identified and classified). An advantage of using such algorithm is that they may reduce the amount of encoded data to be used as an electrical signature for electrical devices to just those features which are necessary to uniquely identify the electrical device, reducing the amount of data that must be stored or transmitted between the electrical outlet and the server.

Using a speech coding algorithm has been found to be particularly convenient since they have been known for some time and software libraries are available to perform this task with a low performance processor implemented in an electrical outlet. Therefore there is no need to send the samples of a sensor signal to a server. Advantageously only the electrical signatures, calculated in the electrical outlet, may have to be communicated to the server.

The one or more features that may be extracted or determined from the frequency domain spectrum may comprise one or more of: a Mel Frequency Cepstral Coefficient (MFCC), Linear Predictive Coding (LPC) Coefficient, Linear Predictive Cepstral Coefficient (LPCC), and a Wavelet.

The database of electrical signatures may be a local database on a local server, i.e., a database that comprises all electrical devices that so far have been connected to the electrical outlets that communicate with the same local server, for example, all electrical outlets of a dwelling or an office. In the event the server cannot retrieve a suitable electrical signature of the electrical device from the database, the server may send a message to a user interface asking the user to identify the electrical device by a name or the brand and type of electrical device. For example, when a user connects a new mobile phone charger to an electrical outlet for the first time, the local server usually would not find an appropriate electrical signature for that newly connected electronic device in the signature database. The local server then opens, for example, a dialogue window on the user's smart phone or tablet and asks the user to type in the brand and type of electrical device or a nick name for that electrical device. For example, the user may enter "Joe's mobile phone charger". The local server can then update the local database. Whenever the individual electrical device is reconnected to the same or another electrical outlet and the electrical signature is sent to the local server, the local server will find the electrical signature in the database and the assigned identity, for the example, the nick name "Joe's mobile phone charger".

The local server may communicate with a central server to which a plurality of local servers are connected. The database of the central server may be maintained by a trusted entity that determines signatures and identities of electrical devices that are available on the market. The central server may also be used to collect signatures and identities of electrical devices that have ever been plugged-in to any of the electrical outlets of all local servers. Preferably, the central server does not accept nick names but only brands and official type names of electrical devices. The local servers, in the event they cannot find a suitable electrical signature of an electrical device in the local signature database, may then query the central server for the identification of the electrical device.

The electrical outlet to which the electrical device is connected communicates with a server, for example, over a wired communications links (such as Ethernet, or powerline) or a wireless communications link (such as Wi-Fi or Zigbee).

The electrical outlets may send periodically the electrical signature of a connected electrical device to the server, indicating that the electrical device is still connected to the electrical outlet. As an option, the electrical outlets may include in the message to the server status information of the connected electrical device, for example, how much power the connected electrical device is drawing from the electrical outlet. This enables the server to generate, on request, a status list with all active electrical device, i.e. electrical devices that are connected to the electrical outlets and are consuming electrical power. If a user of the system is away from home and is concerned that they may have accidently left an electrical device (such as their iron) switched on, the user may connect to the server (for example using an app on their mobile phone or tablet) and check on all active electrical devices in their home (i.e. all electrical devices that are currently connected to the electrical outlets in their home). If the iron is not shown on the list of active electrical devices, the user is reassured that they have not left the iron on.

In another aspect of the invention a processor is configured to generate a control signal for the electrical outlet based on the identity of the electrical device. The electrical outlet further comprises a switch configured to control the supply of electricity to the electrical device connected to the electrical outlet, wherein the switch is controlled based on the control signal.

The processor configured to generate a control signal may be located on the server and the communications interface of the server may be further configured to send the control signal to the electrical outlet. The server may provide a central place for administering the electrical outlets, controlling which electrical outlets are turned on and off based on the identity of the electrical devices connected to the electrical outlet.

This aspect of the invention enables, for example, a user to remotely control their electrical devices, independently of which electrical outlet the electrical devices are connected. Considering the previous scenario, where the user discovered from the status report that their iron had been left switched on at home, the user may send a switch off command to the server and the server switches off the electrical outlet to which the iron is connected.

In another aspect of the invention, the control signal to switch off specific electrical devices is generated based on a policy for controlling the identified electrical device or for controlling a class of electrical devices to which the identified electrical device belongs. In particular, this policy may comprises at least one of: whether operation of the identified electrical device is allowed or disallowed; a length of time for which operation of the identified electrical device is allowed; and a time of day and/or day of the week during which operation of the identified electrical device is allowed. In the event that operation of the identified electrical device is allowed, the control signal is configured to enable the switch of the electrical outlet to supply electricity to the identified electrical device; or in the event that operation of the identified electrical device is disallowed, the control signal is configured to disable the switch of the electrical outlet to prevent the supply of electricity to the identified electrical device.

In a public place (for example, a hospital or an airport), the operator of the public place may wish to allow visitors to use mobile phone chargers on the electrical outlets installed in the public place, but wants to prevent the use of devices that may constitute a safety hazard, for example an iron that may cause a fire or drilling machines that may be used for a burglary. A class database which comprises for each electrical signature in the database at least one class item may be used to restrict or allow usage for certain classes of electrical devices. One class "mobile phone charger" may comprise a list of all known electrical signatures of chargers for mobile phones. Another class "hairdryers" may comprise a list of all signatures of hairdryers.

The policy may be organized as a white list, comprising a list of signatures or classes of electrical devices that are allowed to be used at certain electrical outlets. In the event a new electrical device is connected to an electrical outlet, the electrical outlet sends the electrical signals or the signature of the electrical device, respectively to the policy server. The policy server looks up the policy for the electrical signature or the class of electrical device the electrical signature can be attributed to. In the event the signature cannot be retrieved in the white list, the server will send a control signal to the respective electrical outlet to switch off the switch and thus blocking supply of the device with electrical energy.

Similarly the server may look up a newly connected electrical device in a black list. In the event the electrical signature is not in the black list the electrical device is supplied with electrical power. In case the electrical signature is contained in the black list, the server sends the control signal to the respective electrical outlet to switch off the electrical device in order to block the electrical device from receiving power.

Similarly other restrictions may be applied to the electrical device, for example that an electrical device may only be used during a specified time period, for example electrical heaters may only be allowed during winter months, during business hours, or for a maximum time span.

In another aspect of the invention, the policy prevents an electrical device deemed unsafe from being operated. In a further aspect of the invention, the information about an electrical device deemed unsafe is based on recall information provided by a manufacturer of the electrical device.

From time to time manufacturers become aware that their products may become defective over time. The products of a specific brand and type, identified by their electrical signature could be switched off to avoid any safety hazard caused by this product. The policies of a server may be updated regularly to include electrical devices that have been recalled by their manufacturers.

In another aspect of the invention, a system may comprise a plurality of electrical outlets wherein an electrical device is connected to an electrical outlet of the plurality of electrical outlets, wherein the electrical outlet to which the electrical device is connected is further configured to send, to a server, electrical outlet information which identifies the particular electrical outlet to the server; and a communications interface in the server is further configured to send the control signal to the identified electrical outlet to control the identified electrical device.

The plurality of electrical outlets may comprise a plurality of identified electrical devices. The communications interface in the server may be further configured to receive a request (for example, from a user) to control a particular identified electrical device connected to an electrical outlet of the plurality of electrical outlets. The communications interface in the server may be further configured to send the control signal to the particular identified electrical outlet to control the particular identified electrical device. This may allow the user remote control of particular electrical devices connected to the plurality of electrical outlets, without the user having to install remote control devices between the electrical outlet and a particular electrical device as all electrical devices connected to the plurality of electrical outlets may be controlled. Nor is it necessary for the user to know which electrical outlet the particular electrical device is connected as the system finds the particular electrical outlet using the electrical signature of the particular electrical device. This may allow the user, for example, to use their smartphone to remotely control particular electrical devices, for example, allowing the user to turn off the iron they may have accidently left connected to any electrical outlet at home.

In another aspect of the invention, in the event an electrical signature corresponding to the electrical device is not found in the signature database a request is sent to a user of the electrical device to identify the electrical device and the identity of the electrical device provided by the user is stored in the signature database.

In this aspect of the invention missing entries in the signature database, i.e. signatures of electrical devices that have been sent to the database but cannot be found in the database, can be added to the database with the help of the user. For example, when the user is using an app to control his devices, the app may request the user to add this information when the user has plugged in for the first time a new electrical device to the electrical outlet and the electrical signature of the newly plugged in electrical device cannot be retrieved in the electrical signature database.

In another aspect of the invention, an electrical outlet is configured to supply electrical power to an electrical device. The electrical outlet comprises a sensor configured to measure an electrical signal (for example, an electrical waveform, such as a current or voltage waveform) associated with the electricity supply to the electrical device. A processor is configured to determine an electrical signature of the electrical device based on the measured electrical signal. A communications interface is configured to transmit the electrical signature to a server.

In another aspect of the invention the electrical signal is the electrical current consumed by the electrical device. A common way to measure a current consumed by an electrical device is to measure a voltage drop across a resistor that is connected in series to the load of the electrical device. For high current/power device this would require a fairly large resistor. The invention proposes instead to use a hall-effect sensor measuring the magnetic field caused by the current feeding the electrical device.

The electrical signature of the electrical device may be based on one or more features of a frequency domain spectrum of the electrical signal. The inventors have discovered that various algorithms can be used to extract distinctive and characteristic features from the frequency domain spectrum of the electrical device which can be used to identify the electrical device and distinguish it from other electrical devices.

The inventors have discovered that particularly suitable algorithms for extracting one or more identifying and characteristic features of the electrical device from the electrical signal include audio coding algorithms (which are typically used to encode and compress audio data, such as, speech coding algorithms which are used to compress speech for cellular and internet transmission or for speech recognition) and audio feature extraction algorithms (which are typically used to extract characteristic features from audio signals so that they can be identified and classified). An advantage of using such algorithm is that they may reduce the amount of encoded data to be used as an electrical signature for electrical devices to just those features which are necessary to uniquely identify the electrical device, reducing the amount of data that must be transmitted between the electrical outlet and the server.

Using a speech coding algorithm has been found to be particularly convenient since they have been known for some time and software libraries are available to perform this task with a low performance processor implemented in an electrical outlet. Therefore there is no need to send samples of the electrical signal to a server. Advantageously only the electrical signatures, calculated in the electrical outlet, may have to be communicated to the server.

The one or more features that may be extracted or determined from the frequency domain spectrum may comprise one or more of: a Mel Frequency Cepstral Coefficient (MFCC), Linear Predictive Coding (LPC) Coefficient, Linear Predictive Cepstral Coefficient (LPCC), and a Wavelet.

In another aspect of the invention, the electrical outlet further comprises a receiver configured to receive a control signal from the server, a switch configured to control the supply of electricity to the electrical device connected to the electrical outlet based on the control signal.

The electrical outlet may comprise an electrical outlet identification and the communications interface may be configured to transmit the electrical outlet identification information to the server, for example, when sending an electrical signature to the server.

By using a unique outlet identification, a user can obtain information regarding which electrical outlet an electrical device is connected to. In an initial setup the user may give individual names to each electrical outlet, for example "bedside table", or "TV corner". In case the user is looking for an electrical device, but has lost track where he used it last, he may initiate a search on his smart phone or tablet by selecting an electrical device from a list which comprises all device known to the server. Either the server maintains a list of the status of an electrical device, including to which electrical outlet it was connected last, or the server starts polling information from each electrical outlet regarding which electrical device is currently connected to each electrical outlet.

In another aspect of the invention, a server for controlling electrical devices connected to an electrical outlet comprises a communications interface configured to receive an electrical signature of an electrical device connected to the electrical outlet from the electrical outlet, and a processor configured to compare the electrical signature against a signature database to identify the electrical device.

In another aspect of the invention, a server for controlling electrical devices connected to an electrical outlet comprises a communications interface configured to receive, from an electrical outlet, a measured electrical signal from an electrical device connected to the electrical outlet and a processor configured to determine an electrical signature of the electrical device based on the measured electrical signal and compare the electrical signature against a signature database to identify the electrical device. The electrical signature may be determined based on one or more features of the frequency domain spectrum of the electrical signal.

BRIEF DESCRIPTION OF THE DRAWINGS

Embodiments of the present invention will now be described, by way of example only, with reference to the accompanying drawings, in which.

DETAILED DESCRIPTION

Figure 1:
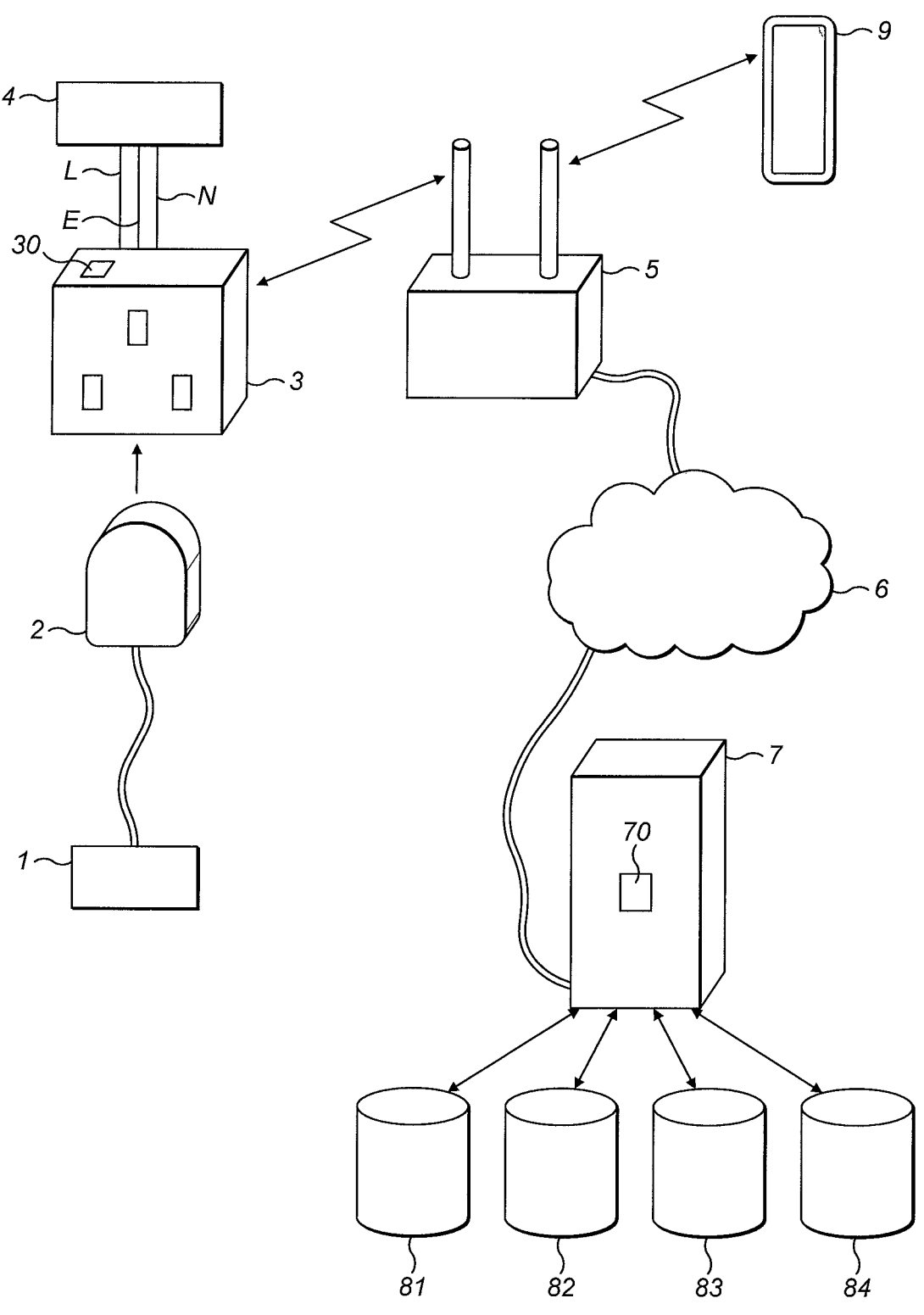
FIG. 1 shows a system with an electrical outlet, a Wi-Fi access station and a server

The term "user" within this document shall refer to any physical person that wants to get information and/or control electrical devices which are used by him or members of a user group, for example members of his family. In the following the term "controlled" is used, even if only information about electrical devices is retrieved. The term "user" herein also refers to organization, or other entity that employs the services provided by the invention, for example a hospital that wants to restrict the use of specific electrical devices by its staff, patients, or visitors. The term a "Single user" includes all members of a user group, as it does not refer to the number of users but to the user, or user group respectively that control the electrical outlets in a specific location, e.g. at home, in an organisation, an office for example, or in a public place. A "user location" shall refer to the area defined by the electrical outlets that are controlled by a single user. Although the system of the invention can be deployed completely locally at a user location some or the majority of task may be performed by a system provider. The term "system provider" refers to a service provider that hosts databases for a plurality of users and may also add extra value by providing information that a user otherwise would have to add himself or would even have no access to this information.

The invention in a wider sense is about collecting data of electrical devices that are, or that have been plugged before into an electrical outlet. As the invention uses the term electrical outlet also for power interfaces to which electrical devices may be fixedly connected, the term "connected to an electrical outlet" will be used for electric devices that are plugged in to an electrical outlet as well as electrical devices that are fixedly connected to any kind of power distribution interface, such as a light switch. An electrical outlet according to the invention is adapted to collect data about electrical signals of a connected electric device that allows for identification of the connected electric device.

At least part of the invention is based on the collection, storing, accessing and comparing of different kind of data. This data may be assembled in relatively small lists, which are administered by a local processor, or in one or more centrally organized databases, administered by one or more central processors. Although a person skilled in the art in computer information technology would refer to a database only if large quantities of information require a database management software to collect and retrieve the information, the term database is used herein to refer to any collection of related data, even if data is retrieved only be reading a data set in sequential order until the data searched for is found or not found, respectively.

In this sense the term "server" relates to a processing device with a processor that is configured to perform at least one of the following tasks: processing received data, for example adding received data to a database, retrieving data in a database, comparing data, generating control signals for controlling the electrical outlets, transmitting data to a user or another database, transmitting control signals to the electrical outlets. In the system more than one server may be deployed, for example a server at the user location, for example integrated into his Wifi station or implemented as a dedicated device, a user control device, for controlling that part of the system that is accessible for a single user, for example with an application installed on a user's smart phone, tablet or laptop, and a central server at the location of the service provider.

In the following databases may be used by the invention:

A user devices database comprising the information of all electrical devices that are attributed to a single user. The user device database comprises the electrical devices that have been identified as having been plugged in at a user location. The user device database may comprise a nickname for each electrical device, and/or information on the brand and/or make of the electrical device. The user device database may also comprise status data for each electrical device, for example if the device is actually connected or not, to which electrical outlet the electrical device is connected or was connected last, or data of usage of the device, for example the power consumption of the electrical device in the last 24 hours. The user device database can be a local database or hosted on a central database.

The term local refers herein to databases that are in proximity to the user, for example installed on a server in the home of a user or the premises of an organisation. In contrast hereto the term "central" refers to a database that can be accessed by a plurality of single users. The term "private data" means in the following data, which is attributed to a single user and therefore another single user should not have access to the private data of that user. In case private data is administered in a central database for a plurality of user, access right management will ensure that access to private data is restricted to the respective single user. In contrast hereto "public data" can be accessed at least by all authorised users of the system.

A "electrical outlet database" stores information about all electrical outlets which are deployed in a single user location. The electrical outlet database may comprise nicknames for the electrical outlets deployed in a user location. When a new electrical outlet is installed the user will be prompted on his user control device to add the location of the electrical outlet to the electrical outlet database, for example "Peter's bedside socket", "Kitchen socket #1", "Kitchen socket #2", "Kitchen socket next to door", whatever is meaningful for the user. The electrical outlet database may be hosted locally, for example in a specially device on site of the user, or on the user's control device, for example his smart phone. In other embodiments the electrical outlet database may be hosted on a central server provided by the system provider, restricted to be accessed only by the single user.

A signature database comprises signatures of previously identified electrical devices. Preferably, the signature database comprises additional information about each of the electrical device, for example the brand and make of an electrical device that allows a person to recognize the electrical device. Optionally the signature data base also comprises at least one category for each electrical device, for example "telephone charger", "hairdryer", "hair straightener", "light bulb", "TV set", washing machine" to name a few. Ideally, the signature database is a centrally hosted database, which allows access to all users of the system. This means for a user, whenever he connects a new electrical device the signature of this device may be already known to the signature database and the user can retrieve any additional information about his electrical device from the signature database rather than entering the additional information himself into his local database. Therefore ideally the signature database is public data and administered centrally by the system provider.

Optionally a "policy database" may be used to administer access rights of identified electrical devices. Therefore the policy database is private data, but could be administered locally or centrally.

FIG. 1 shows one embodiment of the invention wherein an electrical device 1 may be plugged with a power plug 2 into an electrical outlet 3. The electrical outlet 3 is connected with a phase conductor La neutral conductor N and a protective conductor E to a consumer unit 4, historically known as fuse box for supplying electrical power to any electrical device 1 that is plugged into the electrical outlet 3. The electrical device 1 can be any electrical device such as a standard lamp with a light bulb, a hairdryer, a hair straightener, appliances such as washing machines and tumble dryer, or charger for mobile phones or notebook computers, to name a few.

For reasons of clarity FIG. 1 shows only one electrical outlet 1 of a single user. However it is obvious that a user in his home will have installed a plurality of electrical outlets 1. Ideally all electrical outlets in a user's home for example are electrical outlets according to this invention.

It appears perfectly obvious that electric devices with inductive or capacitive loads cause current fluctuations or introduce voltage peaks when they consume electrical power. However, tests have shown that even purely resistive loads introduce fluctuations when they consume electrical power. These fluctuations introduced by an electrical device are characteristic for an electronic and imprint a repetitive pattern to the electrical current, which can be used to distinguish an electrical devices from another electrical device. However, these patterns due to other influences may vary with heat effects frequency and voltage of the supply voltage and other parasitic effects. Rather than comparing directly patterns of the current fluctuations, it is more appropriate to calculate from the current fluctuation pattern a signature for the electric device that ideally eliminates the influence of parasitic effects to the current pattern of an electric device. As a side effect the signature uses less data to describe the current fluctuation pattern and allows for an improved reliability when comparing two signatures of electrical device to decide if they can be attributed to the same electric device or to different electric devices.

As will be shown in more detail further down, the electrical outlet 3 comprises an electrical outlet processor 30 configured to communicate with other entities, that will be explained later and a sampling circuitry for sampling the current that is consumed by the electrical device 1 into data samples. These data samples are communicated by the electrical outlet processor via a Wi-Fi connection 4 from the electrical outlet 3 to a local Wi-Fi access station 5. In this example several electrical outlets may be distinguished from each other by their local IP address, or their MAC code. The Wi-Fi access station 4 then transmits the data samples via a network 6 which in this embodiment is the Internet, to a central server 7 at a remote location. In this embodiment the electrical outlet creates a data block that apart from the data samples also includes the MAC address of the electrical outlet, so that the data samples are attributed to the individual electrical outlet 3 to which the electrical device 1 is plugged into.

A processor in the central server 7 is configured to execute several different software applications and the device location database 81, the user devices database 82, the policy database 83, and the signature database 84. In order to use these databases and the services offered by the system provider each user needs to create a user account on the central server 7, so that his data can be kept private.

During manufacturing of the electrical outlet 3, for example the IP address of a system provider may have been pre-programmed in a non-volatile memory of a processor 30. When new electrical outlets 3 are installed in a user's location, the electrical outlets send their electrical outlet identification to the entity that has been set up in the electrical outlet 3. In the first embodiment this entity is the central server 7 of the system provider. The central server adds the electrical outlet identification to the electrical outlet database 81 of the specific user and sends a request to the user control device 9 to enter a nickname and/or description for this electrical outlet device 3. In future communications from the central server 7 to the user the central server 7 will use this nickname/description so that the user easily knows to which electrical outlet 3 the central server 7 refers to.

When a user connects a new electrical device 1 to the electrical outlet 3, the electrical outlet samples data about the characteristics of the connected device and in this first embodiment sends the sampled data to a pre-defined signature detection server. In this first embodiment the signature detection server is identical to the central server 7. One of the applications executed by the central server 7 in this embodiment is to calculate from the received sampled data a signature for the electrical device 1. The processor 70 of the server 7 tries to retrieve the calculated signature in the signature database 84. If the central server finds a matching entry it adds the electric device 1 to the user device database 82. The central server then sends a request to the user control device 9, asking the user if he wants to assign a nickname/ description for the detected electrical device. The server 7 may retrieve in the electrical outlet database the nickname/ description of the electrical outlet to which the identified device is connected to and prompt this information to the user in order to avoid any misunderstandings. The app on the users control device 9 transmits the use input back to the central server 7 which then can update the user devices database 82 accordingly. For example the user may have given the brand and make of a laptop, recognizes that this is his daughter's laptop and may have given it the nickname "Maria's laptop". Over the time the user devices database 82 will be filled with all devices ever connected to the user's home.

The system may be set up differently. One option could be that all electrical outlets check in regular time intervals, for example every 10 minute the signature of the electrical device 1. As long as the electrical device generates a signature it obviously draws current from the electrical outlet. As this data is send to the central server 7, the central server 7 may update the user devices database 82 that the identified electrical device 1 is still connected to the central server 7. Alternatively, the central 7 sever may pull this information from the electrical outlets 3 by requesting regularly the signature of electrical devices 1 connected to each electrical outlet 3. In one aspect of the invention the electrical outlets 7 have a separate which measures the power consumption of a connected electrical device and include this information in messages to the central server 7.

Assuming that the family of the user is going on holiday and suddenly his wife has doubts whether she has left her hair straightener switched on. In this case the user can log on to his user account at the central server 7 and request a list of all electrical devices at his home that have a status "switched on". Alternatively the app may allow to select from a pull-down list a device and get this information especially for the selected device. In case the hair straightener is still switched on, the user may send a switch off command to the electrical outlet to which the hair straightener is connected to. A controllable switch in the electrical outlet 3 enables the user to switch off the power supply from this particular electrical outlet 3.

Another application could be that parents want to restrict the use of an electronic game device or the use of a TV set of their children. In this case the user may add some rules to the policy database 83. The rules may restrict the user of the children's TV set for example to a maximum time per day, or restrict the use to a certain time window. One possible way to implement the policy rules is that the socket send in regular intervals the signature of a connected device to the policy database 83, a policy database processor looks up the policy database if it comprises a rule for the received signature, and in case the conditions to block an electric device are found, the policy processor send back a control signal to the respective electrical outlet and isolates the electrical device 1 from the power supply.

Similarly other users in other user locations may restrict the use of a certain type of electrical device, for example the use of fan heaters, which have a high power consumption and also cause an increased fire hazard. In this case the policy database 83 may comprise rules which block devices a specific category. In case the user has chosen to implement a policy rule for certain categories of electrical devices 1, and the signature database 84 provides the category of each in the signature data base 84, the policy processor has to compare the category of an identified device 1 with the forbidden category in the policy database 83. In case the policy database indicates that the electrical device is of a category that is not allowed, the policy processor is configured to send a control signal to the electrical outlet to which the device in question is connected to and isolates the device from any electrical power.

In another aspect of the invention the signature database 84 may comprise special information that is provided by a third party, for example by the manufacturer of an electrical device 1. This special information may consist in a warning about the use of the electrical device. By retrieving all users which have this particular electrical device in their user devices database, the central processor may forward this warning to the affected users. Similarly the third party may even mark the device as to be switched off, because the hazard of using this device is so high that the device should be switched off immediately. In this case the signature database processor would generate "switch off" control signals for all affected users and send this to the electrical outlets of all users, or only to users that actually have chosen this option, to switch off the electrical outlet which supplies energy to the hazardous device.

In this embodiments all information about which electrical devices 1 are plugged into which electrical outlet 3, and any other information is stored on the only central server 7. The data of different users is kept invisible for other users and users can only see and edit data related to their user account.

Figure 2:
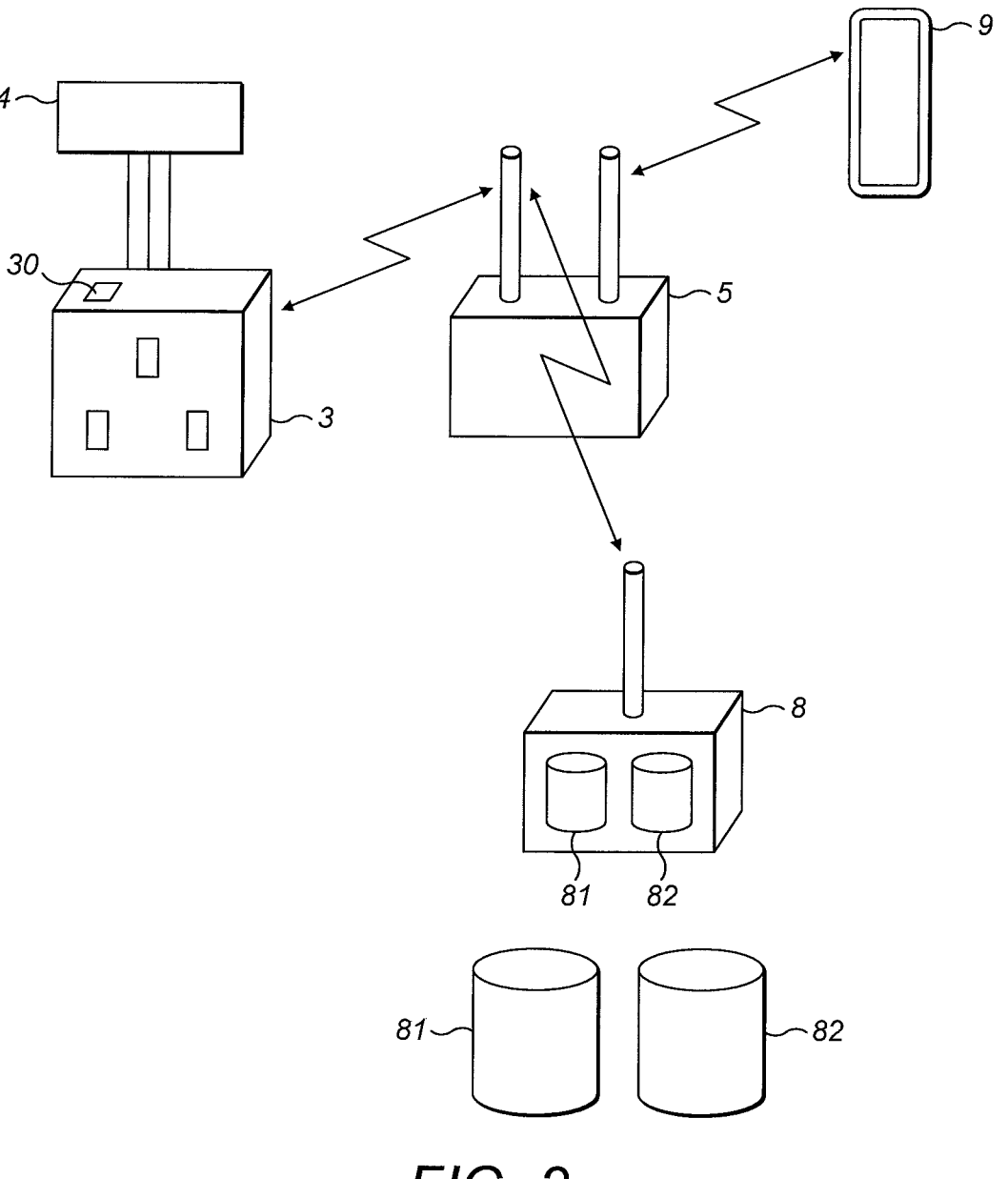
FIG. 2 shows another system with an electrical outlet and a local server

FIG. 2 shows a second embodiment in which the outlet power database 81 and the user devices database 82 are located in a dedicated device control server 8 at the user location. In this embodiment, no policy database 83 has been setup, but also the policy database could be implemented in the device control server 8. There is also no signature database 84 to demonstrate that a minimal embodiment of a device control system could be implemented without access to a signature server. However, this implies more work on the user, as no automatic information is available for the brand and make of an identified electrical device.

In the embodiment of FIG. 2 a processor 30 of the power outlet 3 has been chosen that has sufficient computing power to perform the calculation of the electrical signature in the power outlet 3. This has the advantage that the amount of data to be exchanged, for example, with the device control server 8 is reduced by approximately a factor of 10, due to the data compression achieved by calculating an electrical signature for the connected electrical device. Similarly, electrical outlets with integrated electrical signature calculation can also be used in the previous described embodiment of FIG. 1 with a central server 7. In this case the dedicated electrical signature processing server to calculate the electrical signature from sampled data becomes obsolete.

The person skilled in the art will appreciate that the locations of the databases 81, 82, 83, 84 can be chosen in any location as long as sufficient calculation power and memory is available at a location. So, for example, the outlet power database 81, the user devices database 82, and the policy database may be implemented in a Wi-Fi access station 5, or on a user control device (for example on a tablet 8).

Figure 3:
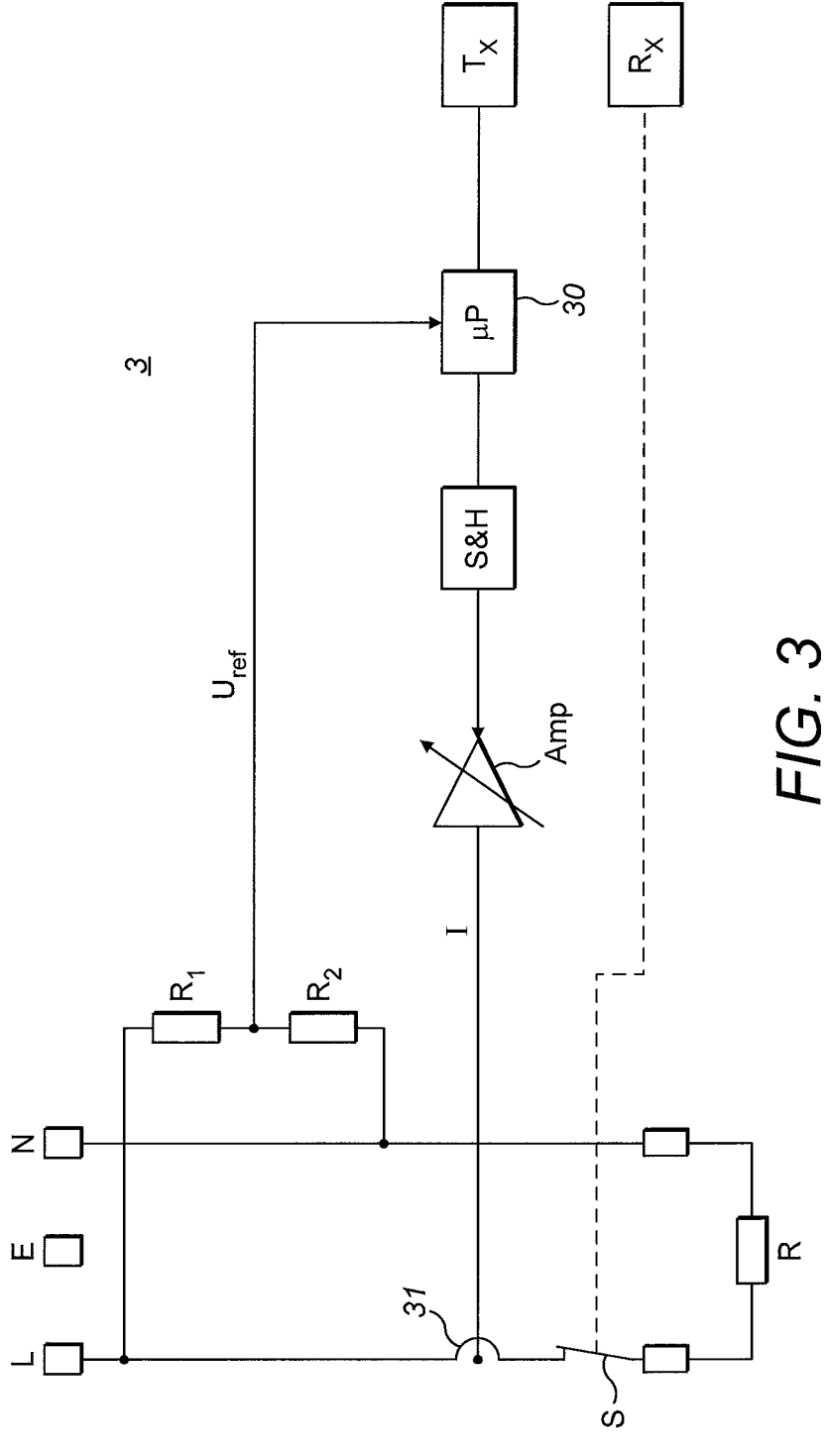
FIG. 3 shows an electrical outlet in more detail.

FIG. 3 shows a hardware implementation of an electrical outlet 3. The electrical outlet is connected with clamps to a live conductor L, a neutral conductor N, and usually to a earth conductor E. Between the live conductor L and the neutral conductor N a voltage divider R1, R2 reduces the voltage to about 3 Volts before it is forwarded to the outlet power processor 30 as a reference voltage Vref. A hall-effect sensor 31 senses the current I that is consumed by a load R of an electrical device 1. In an amplifier Amp the sensor signal is normalized so that, independent of the actual magnitude of the consumed current I, the signal is in a predefined voltage range, so that a sample and hold circuit S&H can use the full sampling range of the sample and hold circuit S&H. After sampling, the data samples are processed by a power outlet processor 30, as explained further down. The output of the power outlet processor 30 is than transmitted by a transmitter Tx, for example, a Wi-Fi circuit, to a receiver, for example the Wi-Fi access station 5. The electrical outlet may comprise a receiver Rx configured to receive IP messages addressed to the electrical outlet. These received signals may for example include a control signal for controlling a switch S, which is in line with the live conductor L to interrupt the power supply from the live conductor to the load R of the electrical device.

The invention identifies an electrical device by analysing an electrical signal that is distinctive of the particular electric device. For example, analysing changes in power consumption of the device over a full time period of the AC power and analysing high frequency current fluctuations onto the electrical current caused by the electrical device. The way the electrical device influences these electrical signals acts like a fingerprint for each different electrical device which allow the electrical device to be identified. The fingerprint tends to be the same or at least similar for a particular make and model of electrical device, allowing a new electrical device to be identified if the same make and model of electrical device has been seen previously. To aid identification, a mathematical representation of the measured electrical signal is created which is called in the following an electrical signature of an electrical device.

In order to determine the electrical signature of an electrical device in one embodiment of the invention, a current sensor measures the current consumed by an electrical device such as a light bulb, a fridge, a mobile phone charger, or a hair dryer to name a few, using a hall effect sensor around the electricity supply to the electrical device.

The inventors have realised that suitable electrical signatures can be generated from one or more identifying and characteristic features in the frequency domain spectrum of the electrical signal. The inventors have discovered that various algorithms can be used to extract distinctive and characteristic features from the frequency domain spectrum of the electrical device which can be used to identify the electrical device and distinguish it from other electrical devices.

The inventors have discovered that particularly suitable algorithms for extracting one or more identifying and characteristic features of the electrical device from the frequency domain spectrum of the electrical signal include audio coding algorithms (which are typically used to encode and compress audio data, such as, speech coding algorithms which are used to compress speech for cellular and internet transmission or for speech recognition) and audio feature extraction algorithms (which are typically used to extract characteristic features from audio signals so that they can be identified and classified). These algorithm reduce the amount of encoded data to be used as an electrical signature for electrical devices to just those features which are necessary to uniquely identify the electrical device. This makes them ideal for reducing the amount of data that must be stored or transmitted between the electrical outlet and the server.

In particular, the inventors have found that speech coding algorithm are particularly suitable, since they have been known for some time and software libraries are available to determine electrical signatures using only a low performance processor, which is desirable for an electrical outlet where cost, size and low power consumption are important considerations.

Also, being able to generate electrical signatures on a low performance processor in the electrical outlet means that there is no need to send samples of the electrical signal to a server, which reduces communications bandwidth which, for example, prevents a network of electrical socks from hogging limited WiFi bandwidth in a home. Instead, only the electrical signatures, calculated in the electrical outlet, have to be communicated to the server.

The one or more features that may be extracted or determined from the frequency domain spectrum can include a Mel Frequency Cepstral Coefficient (MFCC), Linear Predictive Coding (LPC) Coefficient, Linear Predictive Cepstral Coefficient (LPCC), and a Wavelet.

Taking the example of speech coding algorithm as an illustration, several techniques of speech coding (such as Linear Predictive Coding (LPC), Waveform Coding and Sub band Coding) exist which are based on characterizing the vocal track of a human.

Figure 4:
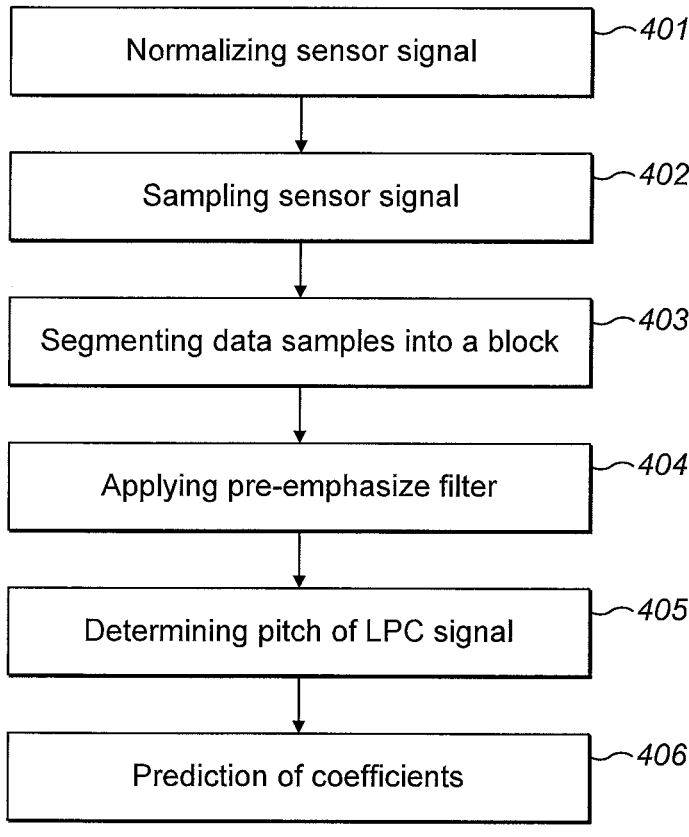
FIG. 4 shows method steps carried out by the system.

FIG. 4 shows the steps carried out by the system to obtain an electronic signature of an electric device 1 connected to an electric outlet 3. As a function of the magnitude of the current consumed by the electrical device, the amplitude of the current will be low for low power consuming devices, such as chargers for mobile phones and high for high power consuming appliances, such as hair dryers or electrical heaters. For this reason the current sensor signal in a first step 401 is normalized, i.e. is amplified to a level close to a predetermined voltage level, for example by an amplifier with variable gain. This ensures that the next sampling step can use the full resolution independent of the magnitude of the power consumed by the electrical device.

In a second step 402 the current sensor signal is sampled at a frequency appropriate to capture all of the necessary frequency components important for processing and recognition. According to the Nyquist theorem, the sampling frequency must be at least twice the bandwidth of the continuous-time signal in order to avoid aliasing. For voice transmission 8 KHz is the typical sampling frequency of choice, as for almost all speakers all significant speech energy is contained in frequencies below 4 kHz. Experiments have shown that similarly for the recognition of electrical devices, a sampling frequency of 8 KHz also is a good choice to obtain sufficiently distinguishable electrical signatures of the electrical devices. However, the person skilled in the art will appreciate that higher sampling frequencies might be used to improve the quality of the recognition of electrical devices. Depending on the results to be achieved, the person skilled in the art will chose an appropriate resolution for the samples. For example for distinguishing all electrical devices in one household a resolution of ten to eleven bit will suffice. For automatic recognition of an electrical device in an external database a higher resolution, for example fifteen to sixteen bit may be necessary.

In a third step 403, the current samples are then segmented into blocks for processing. To generate an electrical signature of the electrical device the block should comprise a full period of the alternating current waveform, which in countries where the mains electricity has a frequency of 50 Hz is 20 ms and in countries where the mains electricity has a frequency of 60 Hz is 24 ms. Preferably, a block always starts at the same time of a period, for example, at a zero-crossing from negative to positive. To ensure this, the samples are taken for the length of two periods, i.e. for 50 Hz mains electricity, samples are taken for 40 ms to ensure that whenever the sampling process starts, at least one full period is within the sampled signal block. Among the sampled block, the beginning of a full period is detected and the samples for the full period are selected. In case of an 8 KHz sampling frequency and 50 Hz mains electricity, 160 samples are selected.

As known in common speech coding algorithms a pre-emphasis filter reduces the dynamic range of the power spectrum. The main goal of the pre-emphasis filter is to boost the higher frequencies in order to flatten the spectrum. This pre-emphasis leads to a better result for the calculation of the coefficients using LPC, and the same is true when using such speech coding algorithms to generate the electrical signatures.

As a fourth step 404, LPC coding would use a voicing detector to classify a given frame as voiced or unvoiced. For determining an electrical signature for an electric device we always assume the signal is voiced. Since voiced speech has energy concentrated in the low frequency region, due to the relatively low value of the pitch frequency, better discrimination can be obtained by low pass filtering the speech signal prior to energy calculation. That is, only energy of low-frequency components is taken into account. For the purpose of determining an electrical signature, a bandwidth of 4000 Hz has been chosen. So far, all tested electrical devices did not produce significant signals above 4000 Hz so that a higher bandwidth is not needed.

In a fifth step 405, the pitch period of the signal is determined. For male speech signals, the possible pitch frequency range is usually found somewhere between 50 Hz and 250 Hz, while for women the range usually falls between 120 and 500 Hz. In terms of period, the range for a male is 4 to 20 ms, while for a female it is 2 to 8 ms. However, when determining electrical signatures of electrical device the inventors observed that the electrical signature covers a range of frequencies across the sampled bandwidth.

Many techniques have been proposed for the estimation of pitch period in speech signals. For the determination of an electrical signature of an electrical device the invention uses an autocorrelation method. An autocorrelation is the average correlation between two samples from one signal that are separated by t samples.

In a sixth step 406 the prediction coefficients are determined by minimizing the mean-square error between the predicted signals, which in the case of electrical signature determination is the final electrical signature and the actual signal. An efficient algorithm known as the Levinson-Durbin algorithm is used to estimate the linear prediction coefficients from a given speech waveform.

In speech coding algorithms usually one of the parameters indicates the volume of a speaker, often described as gain calculation. However, this additional information is obsolete for identifying an electrical device. If information about the actual power consumption is needed, this information could be transmitted as a separate data item.

It has been found that eight to twelve parameters, each parameter coded in twelve to sixteen bit provides sufficient distinctive electrical signatures. The person skilled in the art will appreciate that a higher number of parameters and/or a higher bit resolution can further improve the distinctiveness of the electrical signatures.

The invention claimed is:

1. A system to identify and control an electrical device connected to an electrical outlet of a plurality of electrical outlets, wherein each electrical outlet comprises a sensor configured to measure an electrical signal associated with an electricity supply to an electrical device connected to the electrical outlet, the system further comprising:

a processor configured to:

receive a measured electrical signal of the electrical device connected to the electrical outlet of the plurality of electrical outlets; and determine an electrical signature of the electrical device based on one or more features extracted from a frequency domain spectrum of the electrical signal using a speech coding algorithm; and a processor configured to compare the electrical signature against a signature database to identify the electrical device; and a processor configured to generate a control signal for controlling the electrical outlet to which the identified electrical device is connected;

wherein each electrical outlet further comprises a switch configured to control the supply of electricity to an electrical device connected to the electrical outlet, wherein the control signal operates the switch of the electrical outlet to which the identified electrical device is connected to control the supply of electricity to the identified electrical device based on the control signal;

wherein the speech coding algorithm comprises one or more of: a Linear Predictive Coding (LPC) Coefficient, and a Linear Predictive Cepstral Coefficient (LPCC).

2. The system of claim 1, wherein the control signal is generated based on a policy for controlling the identified electrical device or for controlling a class of electrical devices to which the identified electrical device belongs.

3. The system of claim 2, wherein the policy comprises at least one of: whether operation of the identified electrical device is allowed or disallowed; a length of time for which operation of the identified electrical device is allowed; and a time of day and/or day of the week during which operation of the identified electrical device is allowed.

4. The system of claim 3, wherein:

in the event that the policy indicates that operation of the identified electrical device is allowed, the control signal is configured to enable the switch of the electrical outlet to supply electricity to the electrical device; or in the event that the policy indicates that operation of the identified electrical device is disallowed, the control signal is configured to disable the switch of the electrical outlet to prevent the supply of electricity to the electrical device.

5. The system of claim 4, wherein the policy prevents an identified electrical device deemed unsafe from being operated.

6. The system of claim 5, wherein information about an electrical device deemed unsafe is based on recall information provided by a manufacturer of the electrical device.

7. The system of claim 1, wherein an electrical device is connected to an electrical outlet of the plurality of electrical outlets, wherein the electrical outlet to which the electrical device is connected is further configured to send, to a server, electrical outlet identification information which identifies the particular electrical outlet to the server; and a communications interface in the server is further configured to send the control signal to the identified electrical outlet to control the identified electrical device.

8. The system of claim 1, wherein in the event an electrical signature corresponding to the electrical device is not found in a signature database, a request is sent to a user of the electrical device to identify the electrical device and the identity of the electrical device provided by the user is stored in the signature database.

9. An electrical outlet configured to control the supply of electrical power to an electrical device connected to the electrical outlet, the electrical outlet comprising:

a sensor configured to measure an electrical signal associated with an electricity supply to the electrical device;

a processor configured to determine an electrical signature of the electrical device based on one or more features extracted from a frequency domain spectrum of the electrical signal using a speech coding algorithm;

a communications interface configured to transmit the electrical signature to a server for identifying the electrical device based on the electrical signature and receive a control signal from the server; and a switch configured to control the supply of electricity to the electrical device connected to the electrical outlet based on the control signal;

wherein the speech coding algorithm comprises one or more of: a Linear Predictive Coding (LPC) Coefficient, and a Linear Predictive Cepstral Coefficient (LPCC).

10. The electrical outlet according to claim 9, wherein the electrical signal is the electrical current consumed by the electrical device and wherein the sensor is a hall effect sensor.

11. The electrical outlet according to claim 9, wherein the electrical outlet comprises electrical outlet identification information and the communications interface is configured to transmit the electrical outlet identification information to the server with the electrical signature.

12. A server for controlling electrical devices connected to an electrical outlet, the server comprising:

a communications interface and a processor, wherein the communications interface is configured to receive either:

an electrical signature of an electrical device connected to an electrical outlet, wherein the electrical signature is based on one or more features of a frequency domain spectrum extracted from the electrical signal using a speech coding algorithm; or a measured electrical signal associated with an electricity supply to an electrical device connected to the electrical outlet and the processor is configured to determine an electrical signature of the electrical device based on one or more features of a portion of the frequency domain spectrum extracted from the electrical signature using a speech coding algorithm; and the processor is configured to compare the electrical signature against a signature database to identify the electrical device and generate a control signal for an electrical outlet based on the identity of the electrical device, wherein the control signal operates a switch of the electrical outlet to which the identified electrical device is connected in order to control the supply of electricity to the electrical device connected to the electrical outlet;

wherein the speech coding algorithm comprises one or more of: a Linear Predictive Coding (LPC) Coefficient, and a Linear Predictive Cepstral Coefficient (LPCC).

* * * * *